(12) United States Patent
Eliasson et al.

(10) Patent No.: US 6,534,784 B2
(45) Date of Patent: Mar. 18, 2003

(54) METAL-OXIDE ELECTRON TUNNELING DEVICE FOR SOLAR ENERGY CONVERSION

(75) Inventors: Blake J. Eliasson, Boulder, CO (US); Garret Moddel, Boulder, CO (US)

(73) Assignee: The Regents of the University of Colorado, Boulder, CO (US)

(*) Notice: Subject to any disclaimer, the term of this patent is extended or adjusted under 35 U.S.C. 154(b) by 0 days.

(21) Appl. No.: 09/860,988

(22) Filed: May 21, 2001

(65) Prior Publication Data

US 2002/0171078 A1 Nov. 21, 2002

(51) Int. Cl.$^7$ ................................. H01L 29/06
(52) U.S. Cl. ............... 257/25; 257/17; 257/21; 136/206; 136/255
(58) Field of Search ............... 257/25, 17, 21; 136/206, 255

(56) References Cited

U.S. PATENT DOCUMENTS 5,018,000 A    5/1991  Yamada et al. ............... 357/51

OTHER PUBLICATIONS

John G. Simmons, Electric Tunnel Effect between Dissimilar Electrodes Separated by a Thin Insulating Film, Sep., Journal of Applied Physics, V34, p 2581, Sep 1963.
S. R. Pollack and C. E Morris, Electron Tunneling through Asymmetric Films of Thermally Grown $Al_2O_3$, May 1964, Journal of Applied Physics, V35, N5, p 1503–1513.
L. O. Hocker, D. R. Sokoloff, V. Daneu, A. Szoke, and A. Javan, Frequency Mixing in the Infrared and Far–Infrared using a Metal–to–Metal Point Contact Diode, Jun. 15, 1968, American Institute of Physics, V 12, N 12, p 401–402.
S. M. Faris, T. Kenneth Gustafson, and John C. Wiesner, Detection of Optical Infrared Radiation with DC–Biased Electron–Tunneling Metal–Barrier–Metal Diodes, Jul. 1973, IEEE Journal of Quantum Electronics, V QE–9, N 7, p 737–745.
C. Fumeaux, W. Herrmann, F. K. Kneubuhl, and H. Rothuizen, Nanometer Thin–Film Ni–NiO–Ni Diodes for Detection and Mixing of 30 THz Radiation, Jul. 1998, Infrared Physics and technology, V 39, 123–183.
B. Michael Kale, Electron Tunneling Devices in Optics, Mar. 1985, Optical Engineering, V 24, N 2, p 267–274.
G. Papp, M. DiVentra, C. Coluzza, A. Baldereschi, and G. Margaritondo, Current Rectification through a Single–Barrier Resonant Tunneling Quantum Structure, 1995, Superlattices and Microstructures, V 17, N 3, p 273–275, Month unknown.
Alexander Korotkov and Konstantin Likharev, Resonant Fowler–Nordheim Tunneling through Layered Tunnel Barriers and its Possible Applications, Mar. 1999, International Electron Device Meeting Technical Digest.

(List continued on next page.)

Primary Examiner—David Nelms
Assistant Examiner—Tu-Tu Ho
(74) Attorney, Agent, or Firm—Stephen C. Shear; Yoriko Morita

(57) ABSTRACT

The electron tunneling device includes first and second non-insulating layers spaced apart such that a given voltage can be provided therebetween. The device also includes an arrangement disposed between the non-insulating layers and configured to serve as a transport of electrons between the non-insulating layers. This arrangement includes a first layer of an amorphous material such that using only the first layer of amorphous material in the arrangement would result in a given value of a parameter in the transport of electrons, with respect to the given voltage. The arrangement further includes a second layer of material, which is configured to cooperate with the first layer of amorphous material such that the transport of electrons includes, at least in part, transport by tunneling, and such that the parameter, with respect to the given voltage, is increased above the given value of the parameter.

51 Claims, 6 Drawing Sheets

OTHER PUBLICATIONS

T. Suemasu et al, Metal(CoSi$_2$)/Insulator (CaF$_2$) Resonant Tunneling Diode, Jan. 1994, Jpn. Journal of Applied Physics, V 33, p. 57–65.

M. Asada, K. Osada, and W. Saitoh, Theoretical Analysis and Fabrication of Small Area Metal/Insulator Resonant Tunneling Diode Integrated with Patch Antenna for Terahertz Photon Assisted Tunneling, 1998, Solid State Electronics, V 42, N7–8, p1543–1546, Month unknown.

Aleksanyan et al, Feasibility of Developing a Tunable Oscillator Utilizing a System of Metal–Barrier–Metal–Barrier-Metal Junctions, May 1981, Sov. J Quantum Electron, vol. 11, No. 5, PP 635–637.

Aleksanyan et al, Generation of Electromagnetic Oscillations in Metal–Barrier–Metal–Barrier–Metal Structures, Aug. 1982, Sov. J. Quantum Electron., vol. 12, No. 8, pp. 1090–1092.

Belenov et al, Amplification of Plasma Oscillations in Complex Metal–Barrier–Metal Structures, Jul. 1982, Sov. J. Quantum Electron., vol. 12, No. 7, pp. 930–931.

Belenov et al, Investigation of the Radiation Emitted by Metal–Barrier–Metal Structures, Apr. 1983, Sov. J. Quantum Electron., vol. 13, No. 4, pp. 451–455.

Belenov et al, Angular Distribution of the Luminescence Emitted by a Metal–Barrier–Metal Diode, May 1985, Sov. J. Quantum Electron., vol. 15, No. 5, pp. 735–737.

Belenov et al, Resonant Tunneling in Multilayer Structures in the Presence of Surface Electromagnetic Waves, Apr. 1986, Sov. Tech. Phys. Lett., vol. 12, No. 4, pp. 200–202.

Belenov et al, Emission of Surface Electromagnetic Waves in the Case of Resonance Tunneling of Electrons, Oct. 1987, Sov. J. Quantum Electron., vol. 17, No. 10, pp. 1348–1352.

Bykovskii et al, Influence of the Boundary of a Metal Film on the Luminescence Intensity from a Metal–Barrier–Metal Structure, Sov. Phys. Tech. Phys., Aug. 1986, vol. 31, No. 8, pp. 980–981.

METAL-OXIDE ELECTRON TUNNELING DEVICE FOR SOLAR ENERGY CONVERSION

STATEMENT REGARDING FEDERALLY SPONSORED RESEARCH

The United States Government has rights in this invention pursuant to contract number DAAG55-98-C-0036 awarded by DARPA in conjunction with the U.S. Army Research Office.

BACKGROUND OF THE INVENTION

The present invention relates generally to optoelectronic devices and, more particularly, to electron tunneling devices, especially for solar energy conversion.

Recent energy crises have highlighted the growing demands placed on traditional sources of power, such as gas and electricity. With rising energy costs, it is desirable to find alternative power sources to augment traditional power sources such as hydroelectric and thermonuclear. Solar energy conversion provides such an alternative by tapping into the readily available power of the sun.

One of the main obstacles preventing the proliferation of solar energy conversion systems is efficiency. Currently available semiconductor solar cell systems are not able to provide the amount of power for the dollar that is possible by traditional power sources. Especially semiconductor solar cells with high energy conversion efficiency (ratio of incident solar power to electrical power out) are expensive. Most solar cell systems are based on semiconductor technology, which can be difficult to scale to the size required for large solar panels. Using the present technology, it is expensive to fabricate a semiconductor-based solar panel which is large enough to replace the traditional sources of power. Moreover, semiconductor devices are generally single bandgap energy devices. This characteristic of semiconductor devices means that no current is produced when a photon having energy less than the bandgap energy is incident on the semiconductor device and, when a photon having energy greater than the bandgap energy is incident on the semiconductor device, only current corresponding to the bandgap energy is produced in the semiconductor device. In other words, the response of the semiconductor device is limited by the bandgap energy. Thus, the semiconductor device does not respond at all to photons having energy less than the bandgap energy, and incident electromagnetic energy in excess of the bandgap energy is wasted in the energy conversion. Therefore, the energy conversion efficiency of the semiconductor device is low, on the order of 25% or less. Therefore, it would be desirable to achieve effective solar energy conversion using materials other than semiconductors.

One possible alternative to semiconductors is the use of a metal-insulator-metal (MIM) configuration.[1-6] The MIM configuration is relatively inexpensive to manufacture in comparison to semiconductor-based systems. The native oxides of the metals are generally used as the insulator materials, therefore the MIM configuration is straightforward to fabricate. Efforts have been made even as recently as 1998 (See Ref. 6) to improve the characteristics of MIM devices, without substantially modifying the basic MIM configuration. Recent research in this area include efforts to use the MIM configuration to potentially provide devices capable of detecting and mixing signals at optical frequencies at optical communications wavelengths.

Turning now to the drawings, wherein like components are indicated by like reference numbers throughout the various figures, attention is immediately directed to FIGS. 1A–1E. FIGS. 1A–1E illustrate the operation of an MIM device for reference purposes. As a simplified configuration, an MIM device is illustrated in FIG. 1A. The MIM device, generally indicated by reference number 10, includes first and second metal layers 12 and 14, respectively, with an insulator layer 16 positioned therebetween. A corresponding energy band profile 20 is shown in FIG. 1B. Energy band profile 20 represents height of the Fermi level in the metals and the height of the conduction band edge in the insulator (y-axis 22) as a function of distance (x-axis 24) through MIM device 10 in the absence of provided voltage across the device. FIG. 1C illustrates a first modified energy band profile 30 when a voltage is provided in a reverse direction to MIM device 10. The voltage may be provided by, for example, an applied external voltage or an induced voltage due to the incidence of electromagnetic energy. In this case, tunneling of the electrons (not shown) can occur in a reverse direction, represented by an arrow 36. In contrast, as shown in FIG. 1D, when a voltage is provided in a forward direction to MIM device 10, a second modified energy band profile 40 results. In the case of the situation shown in FIG. 1D, tunneling of the electrons can again occur but in a forward direction, represented by an arrow 46. FIG. 1E illustrates a typical I-V curve 50 of current (y-axis 52) as a function of voltage (x-axis 54) for MIM device 10. I-V curve 50 demonstrates that the MIM device functions as a rectifying element. An MIM device provides rectification and energy detection/conversion by tunneling of electrons between first and second metal layers 12 and 14.

Continuing to refer to FIGS. 1A–1E, in energy conversion applications, it is further desirable to achieve high degrees of asymmetry and nonlinearity and sufficiently high current magnitudes in the current-to-voltage performance (I-V curve). If the current magnitude is too low, the incident electromagnetic energy will not be collected with high efficiency. The required current magnitude is a function of the MIM device geometry, dielectric properties of the oxide, and the size and number of the incident electromagnetic energy quanta. A higher degree of asymmetry in the I-V curve between positive values of V (forward bias voltage) and negative values of V (reverse bias voltage) about the operating point results in better rectification performance of the device. In addition, the differential resistance of the device, which influences the responsivity and coupling efficiency of the device to incoming electromagnetic energy, is directly related to the nonlinearity of the I-V curve. An optimal value of differential resistance is required to impedance match the MIM device to the antenna resulting in maximum power transfer to the device. The differential resistance of MIM devices are often too large for energy conversion applications and, consequently, it is desirable to lower differential resistance values in order to impedance match the antenna. In other words, in solar energy conversion applications, it is preferable to have a higher degree of nonlinearity in the I-V curve and optimal value of differential resistance in the device, thus yielding higher sensitivity of the device to incoming solar energy. As a result, high degrees of asymmetry and nonlinearity in the current-to-voltage characteristics of the device yields high efficiency in the energy conversion process. Currently available MIM devices are not able to provide sufficiently high degrees of asymmetry and nonlinearity with sufficiently low differential resistance in the current-to-voltage performance, hence the energy conversion efficiency of MIM devices is low.

A known alternative to the simple MIM device is a device with additional metal and insulator layers, as demonstrated by Suemasu, el al. (Suemasu)[7] and Asada, et al (Asada).[8] The devices of Suemasu and Asada have the configuration of MIMIMIM, in which the three insulator layers between the outer metal layers act as a triple-barrier structure. The insulator layers are crystalline insulator layers formed by an epitaxial growth procedure detailed in Ref. 7. The presence of the barriers between the outer metal layers result in resonant tunneling of the electrons between the outer metal layers under the appropriate bias voltage conditions, as opposed to simple, tunneling of the MIM device. The resonant tunneling mechanism in the electron transport yields increased asymmetry and nonlinearity and reduced differential resistance values for the MIMIMIM device. The resonance tunneling also results in a characteristic resonance peak in the current-voltage curve of the device, which yields a region of negative differential resistance and leads to the possibility of optical devices with very fast responses and high efficiency.

However, the MIMIMIM devices of Suemasu and Asada have the distinct disadvantage of being a much more complicated device than the simple MIM device. The fabrication procedure of Suemasu includes the deposition of cobalt, silicon and calcium fluoride to form alternating layers of $CoSi_2$ and $CaF_2$. These rather exotic layer materials were chosen due to the crystalline lattice matching constraints inherent in the epitaxial growth procedure. Several of the difficulties in the fabrication procedure, such as the problem with agglomeration of cobalt on the CaF2 layer as well as the multiple photolithography and selective etching steps required to form the final device after the MIMIMIM layers have been grown, are described in Ref. 7. Suemasu also contends that the use of a triple-barrier structure, rather than a slightly simpler double-barrier structure, is necessary in order to achieve negative differential resistance resulting from resonant tunneling using only metal and insulator layer combinations, thus avoiding the use of semiconductor materials. In addition, Suemasu requires that the thickness of the individual metal and insulator layers must be strictly controlled to the atomic layer level in order to achieve the resonance tunneling effect. Therefore, although the goal of increased nonlinearity and asymmetry may be achieved in the MIMIMIM devices of Suemasu and Asada using metal and insulator combinations, the simplicity of the MIM structure is lost.

An alternative device structure that has been suggested to achieve resonant tunneling in semiconductor devices is the use of two adjacent insulator layers between two semiconductor layers, resulting in a semiconductor-insulator-insulator-semiconductor (SIIS) structure described by Papp, et al. (Papp).[9] Papp describes a theoretical SIIS structure, in which the two crystalline insulator layers are formed of two different insulator materials by crystal growth techniques. The SIIS structure is said to yield a resonant tunneling effect with negative differential resistance, increased nonlinearity and asymmetry as well as negative differential resistance, similar to that shown in the aforedescribed MIMIMIM devices of Suemasu and Asada, although an actual SIIS structure has not yet been implemented, to the Applicants' knowledge. Current crystal growth techniques theoretically enable the implementation of the SIIS structure, but an SIIS device would still embody the drawbacks inherent in semiconductor materials, namely cost efficiency in large area devices. In addition, Suemasu (see Ref. 7) speculates that the recent trend of decreasing the size of electronic devices in order to achieve high speed switching will make semiconductor-based devices impractical due to fluctuation of carrier concentration, which occurs when semiconductor devices are reduced to mesoscopic regimes.

As will be seen hereinafter, the present invention provides a significant improvement over the prior art as discussed above by virtue of its ability to provide the increased performance while, at the same time, having significant advantages in its manufacturability. This assertion is true for electromagnetic devices generally, which take advantage of the present invention, as well as solar energy conversion devices in particular.

REFERENCES

1. J. G. Simmons, "Electric tunnel effect between dissimilar electrodes separated by a thin insulating film," *Journal of Applied Physics*, 34 (1963).

2. S. R. Pollack and C. E. Morris, "Electron tunneling through asymmetric films of thermally grown $Al_2O_3$," *Journal of Applied Physics*, vol. 35, no. 5 (1964).

3. L. O. Hocker, et al., "Frequency mixing in the infrared and far-infrared using a metal-to-metal point contact diode," *Applied Physics Letters*, vol. 12, no. 12 (1968).

4. S. M. Faris, et al., "Detection of optical and infrared radiation with DC-biased electron-tunneling metal-barrier-metal diodes," *IEEE Journal of Quantum Electronics*, vol. QE-9, no. 7 (1973).

5. B. Michael Kale, "Electron tunneling devices in optics," *Optical Engineering*, vol. 24, no. 2 (1985).

6. C. Fumeaux, et al., "Nanometer thin-film Ni—NiO—Ni diodes for detection and mixing of 30 THz radiation," *Infrared Physics and Technology*, 39 (1998).

7. T. Suemasu, et al., "Metal $(CoSi_2)$/Insulator$(CaF_2)$ resonant tunneling diode," *Japanese Journal of Applied Physics*, vol. 33 (1994).

8. M. Asada, et al., "Theoretical analysis and fabrication of small area Metal/Insulator resonant tunneling diode integrated with patch antenna for terahertz photon assisted tunneling," *Solid Slate Electronics*, vol. 42, no. 7–8 (1998).

9. G. Papp, et al, "Current rectification through a single-barrier resonant tunneling quantum structure," *Superlattices and Microstructures*, vol. 17, no. 3 (1995).

SUMMARY OF THE INVENTION

As will be described in more detail hereinafter, there is disclosed herein an electron tunneling device including first and second non-insulating layers. The first and second non-insulating layers are spaced apart from one another such that a given voltage can be provided across the first and second non-insulating layers, either by an applied external bias voltage or, for example by an induced voltage due to the incidence of solar energy without an applied voltage or both. The electron tunneling device further includes an arrangement disposed between the first and second non-insulating layers and configured to serve as a transport of electrons between the first and second non-insulating layers. This arrangement includes a first layer of an amorphous material configured such that using only the first layer of the amorphous material in the arrangement would result in a given value of a first parameter in the transport of electrons, with respect to the given voltage. However, in accordance with one aspect of the invention, the arrangement includes a second layer of material, which second layer is configured to cooperate with the first layer of amorphous material such that the transport of electrons includes, at least in part, transport by a mechanism of tunneling, and such that the first parameter, with respect to the given voltage, is increased over and above the given value of the first parameter. The first parameter is, for example, nonlinearity or asymmetry in the electron transport.

In another aspect of the invention, the first layer of amorphous material, if used alone in the arrangement of the electron tunneling device, would result in a given value of a second parameter in the transport of electrons, with respect to the given voltage, but the second layer of material is also configured to cooperate with the first layer of amorphous material such that second parameter in the transport of electrons, with respect to the given voltage, is reduced below the given value of the second parameter. The second parameter is, for example, differential resistance.

In yet another aspect of the invention, a device for converting solar energy incident thereon into electrical energy is described. The device has an output and provides the electrical energy at the output. The device includes first and second non-insulating layers spaced apart from one another such that a given voltage can be provided across the first and second non-insulating layers. The device also includes an arrangement disposed between the first and second non-insulating layers and configured to serve as a transport of electrons between the first and second non-insulating layers. The arrangement includes a first layer of an amorphous material. The arrangement also includes a second layer of material configured to cooperate with the first layer of the amorphous material such that the transport of electrons includes, at least in part, transport by a mechanism of tunneling, and such that the solar energy incident on the first and second non-insulating layers, at least in part, is extractable as electrical energy at the output.

BRIEF DESCRIPTION OF THE DRAWINGS

The present invention may be understood by reference to the following detailed description taken in conjunction with the drawings briefly described below.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 2A:
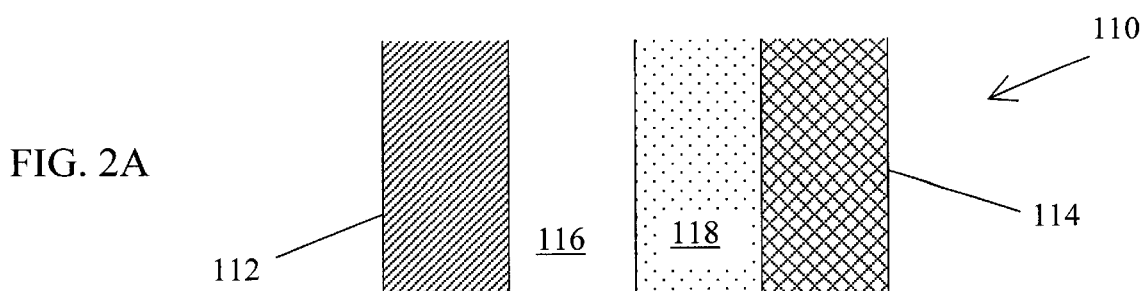
FIG. 2A is a diagrammatic illustration of an electron tunneling device designed in accordance with the present invention.

Referring now to FIG. 2A, an electron tunneling device designed in accordance with the present invention is described. The electron tunneling device, generally indicated by reference number 110, includes a first non-insulating layer 112 and a second non-insulating layer 114. Non-insulating materials include, for example, metals, superconductors, semiconductors, semimetals, quantum wells and superlattice structures. First non-insulating layer 112 and second non-insulating layer 114 can be formed, for example, of two different metals, such as chromium and aluminum, by conventional methods such as, but not limited to, thermal evaporation and sputtering. First non-insulating layer 112 and second non-insulating layer 114 are spaced apart such that a given voltage can be provided therebetween. The given voltage can be, for instance, a bias voltage from an external voltage source (not shown) that is directly applied to the first and second non-insulating layers. Alternatively, as will be seen, the given voltage can be induced by, for example, solar energy. Furthermore, the given voltage can be a combination of induced voltage (from incident electromagnetic radiation, for example) and an applied external bias voltage.

Continuing to refer to FIG. 2A, a first amorphous layer 116 is disposed between first non-insulating layer 112 and second non-insulating layer 114. For purposes of this application, an amorphous material is considered to include all materials which are not single crystal in structure. First amorphous layer 116 can be, for example, a native oxide of first non-insulating layer 112. For instance, if a layer of chromium is used as first non-insulating layer 112, the layer of chromium can be oxidized to form a layer of chromium oxide to serve as first amorphous layer 116. Other suitable materials include, but are not limited to, silicon dioxide, niobium oxide, titanium oxide, aluminum oxide, zirconium oxide, tantalum oxide, hafnium oxide, yttrium oxide, magnesium oxide, silicon nitride and aluminum nitride. Electron tunneling device 110 further includes a second layer 118 positioned between first non-insulating layer 112 and second non-insulating layer 114. Second layer 118 is formed of a predetermined material, which is different from first amorphous layer 116 and is configured to cooperate with first amorphous layer 116 such that first amorphous layer and second layer 118 serve as a transport of electrons between the first and second non-insulating layers. The predetermined material, which forms second layer 118, can be, for example, an amorphous insulator such as, but not limited to, chromium oxide, silicon dioxide, niobium oxide, titanium oxide, aluminum oxide, zirconium oxide, tantalum oxide, hafnium oxide, yttrium oxide, magnesium oxide, silicon nitride, aluminum nitride and a simple air or vacuum gap. Preferably, second layer 118 is formed of a material having a lower or higher work function than that of first amorphous layer such that the device exhibits an asymmetry in the energy band diagram.

Had the device consisted of only the first and second non-insulating layers and the first amorphous layer, the device would be essentially equivalent to the prior art MIM device and would exhibit a given degree of nonlinearity, asymmetry and differential resistance in the transport of electrons. However, the inclusion of second layer 118, surprising and unexpectedly, results in increased degrees of nonlinearity and asymmetry over and above the given degree of nonlinearity and asymmetry while the differential resistance is reduced, with respect to the given voltage. This increase in the nonlinearity and asymmetry and reduction in differential resistance is achieved without resorting to the use of epitaxial growth techniques or crystalline layers of the aforedescribed prior art. The mechanism of this increase is described immediately hereinafter in reference to FIGS. 2B–2E.

Figure 1A:
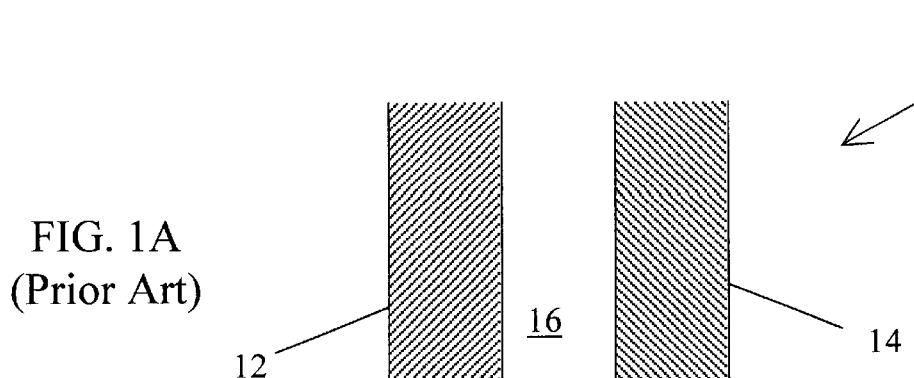
FIG. 1A is a diagrammatic illustration of a prior art device using a metal-insulator-metal (MIM) configuration.
Figure 1B:
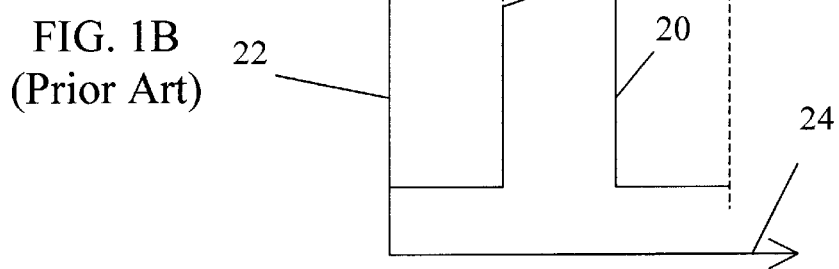
FIGS. 1B–1D are graphs illustrating the schematic energy band profiles of the MIM device of FIG. 1A for various voltages provided across the MIM device.
Figure 2B:
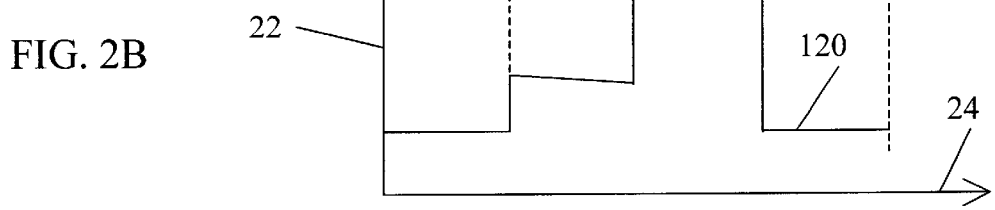
FIG. 2B–2D are graphs illustrating the schematic energy band profiles of the electron tunneling device of FIG. 2A for various voltages provided across the electron tunneling device.

Referring to FIG. 2B in conjunction with FIGS. 1B and 2A, a schematic of a energy band profile 120 corresponding to electron tunneling device 110 is illustrated. Energy band profile 120 includes four regions corresponding to the four layers of electron tunneling device 110, in comparison to the three regions shown in energy band profile 20 of the prior art MIM device. The presence of second layer 118 contributes to the change in the energy band profile of electron tunneling device 110.

Figure 1C:
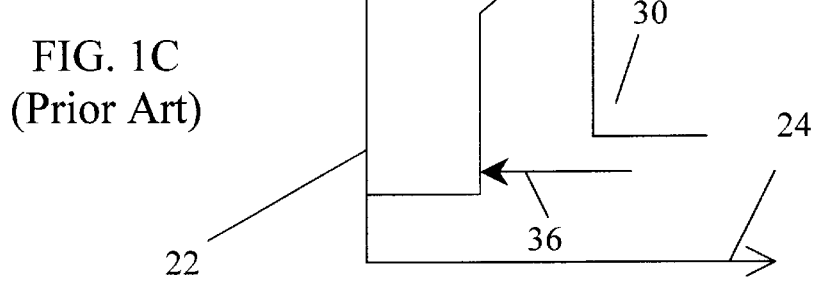
Figure 1D:
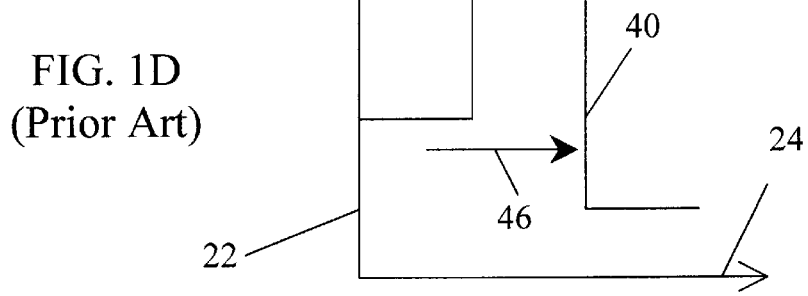
Figure 2C:
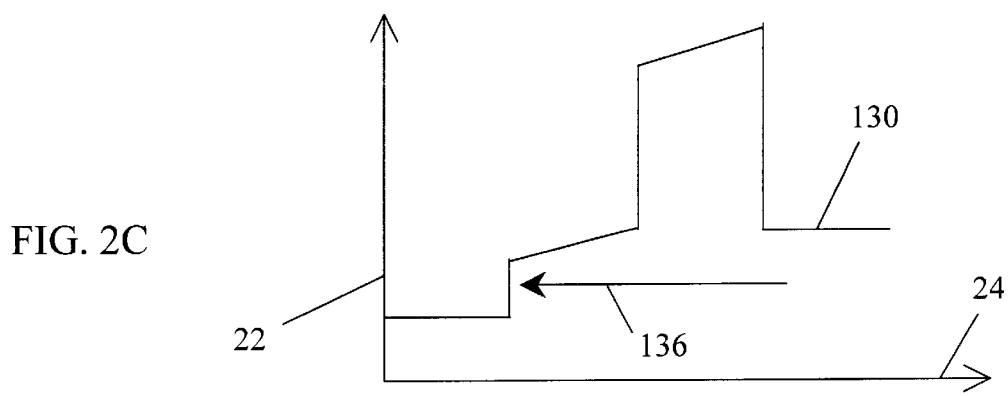
Figure 2D:
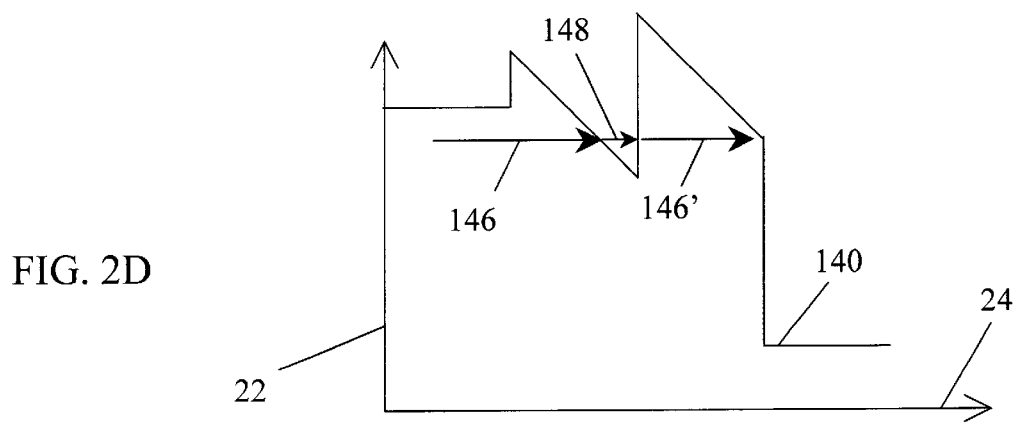

Turning now to FIGS. 2C and 2D in conjunction with FIGS. 1C and 1D, the changes in the energy band profile due to voltage application are shown. During reverse bias operation of electron tunneling device 110, the energy band profile changes to that shown as line 130, which is relatively similar to the case of reverse bias operation shown in FIG. 1C for the MIM device. In the situation shown in FIG. 2C, the primary mechanism by which electrons travel between the first and second non-insulating layers is tunneling in a reverse direction indicated by an arrow 136. When a forward bias voltage is provided, however, a modified energy band profile 140 of FIG. 2D results. In this case, tunneling occurs in paths 146 and 146', but there now exists a quantum well region through which resonant tunneling occurs, as shown by arrow 148. In the region of resonant tunneling, the ease of transport of electrons suddenly increase, therefore resulting in increased current between the non-insulating layers of electron tunneling device 110.

Continuing to refer to FIG. 2D, the addition of second layer 118 provides a path for electrons to travel through the device by a resonant tunneling rather than the tunneling process of the prior art MIM device. As a result, more current flows between the non-insulating layers of electron tunneling device 110, as compared to the MIM device, when a positive voltage is provided while the current flow with a negative voltage provided to the electron tunneling device of the present invention. The presence of resonant tunneling in electron tunneling device 110 therefore results in increased nonlinearity and asymmetry in comparison to the prior art MIM device.

Figure 1E:
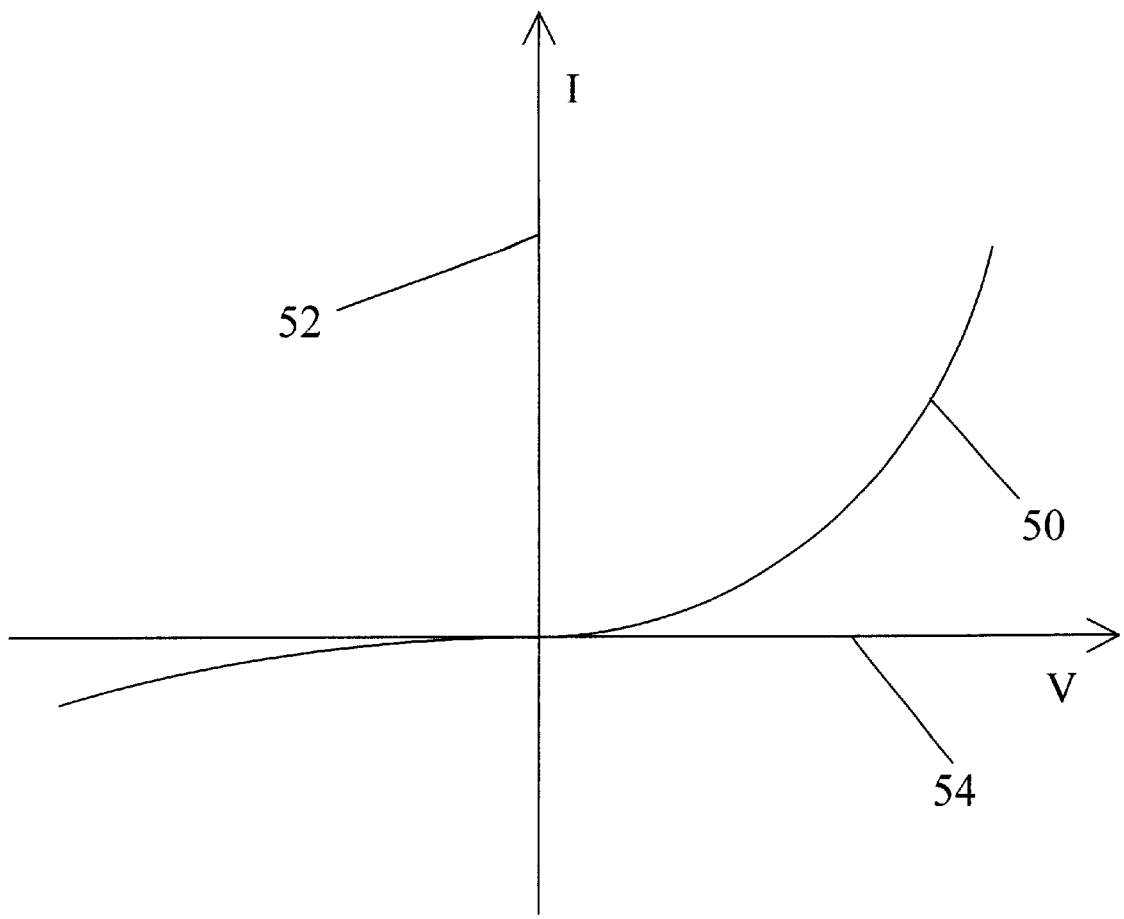
FIG. 1E is a graph of a typical current-voltage curve for the MIM device of FIG. 1A.
Figure 2E:
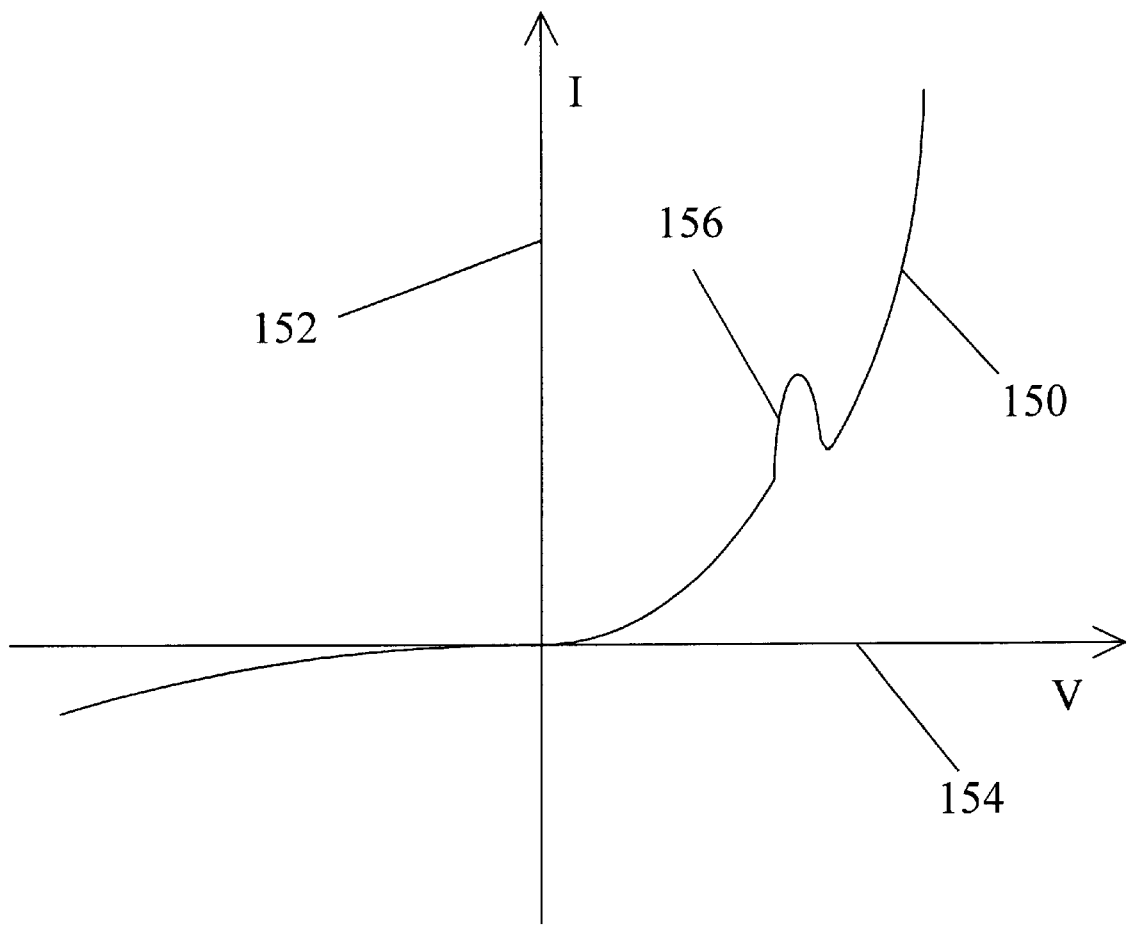
FIG. 2E is a graph of a typical current-voltage curve for the electron tunneling device of FIG. 2A.

A typical I-V curve 150 corresponding to electron tunneling device 110 is shown in FIG. 2E. I-V curve 150 demonstrates that electron tunneling device 110 functions as a diode, where the diode is defined as a two-terminal electronic element. Furthermore, I-V curve 150 is shown to include a resonance peak 156 corresponding to the provided voltage region in which resonant tunneling occurs. The appearance of resonant tunneling in actually fabricated devices of the present invention depends on the precision of the fabrication process. Even when resonance peak 156 is not present, I-V curve 150 exhibits a higher degree of asymmetry and nonlinearity in comparison to the I-V curve of the prior art MIM device (as shown in FIG. 1E). In other words, while the presence of a resonance peak in the I-V curve of an electron tunneling device of the present invention may lead to additional advantages in certain applications, such as greatly increased nonlinearity around the resonance peak, the electron tunneling device of the present invention achieves the goal of increased asymmetry and nonlinearity with reduced differential resistance in the current-to-voltage performance even when the averaging effect of the amorphous layer "washes out" the resonance peak. Therefore, electron tunneling device 110 essentially includes all of the advantages of the prior art MIMIMIM device, without the complicated fabrication procedure and the use of exotic materials, and all of the advantages of the prior art SIIS device, without the drawbacks of the use of semiconductor materials as described above. Despite and contrary to the teachings of Suemasu, the electron tunneling device of the present invention is able to achieve increased nonlinearity and asymmetry and decreased differential resistance in the transport of electrons through the device, using readily available metals and insulators in a simple structure that is simply manufactured compared to the more complex manufacturing processes of the prior art.

It is emphasized that the electron tunneling device of the present invention combines the simplicity of the MIM device with the performance characteristics of the MIM-IMIM devices of Suemasu and Asada while using readily available materials and avoiding the use of semiconductors. Although superficially similar to the SIIS device in structure at first glance due to the presence of two adjacent insulator layers, the addition of second layer 118 in electron tunneling device 110 is not easily accomplished due to fundamental differences in the fabrication procedure (crystal growth and doping techniques in the semiconductor devices versus the oxidation and deposition techniques used in the present invention). In fact, Suemasu and Asada resort to the more complex MIMIMIM structure formed by epitaxial growth techniques in order to achieve the same resonant tunneling effect. The crystalline growth and epitaxial growth techniques used in the SIIS device of Papp and the MIMIMIM devices of Suemasu and Asada preclude the use of amorphous insulator materials in the SIIS device or the MIM-IMIM device since crystalline growth and epitaxial growth techniques, by definition, are able to form only crystalline layers. In fact, the crystalline materials that may be used in the SIIS device or the MIMIMIM device are limited by substrate compatibility (for the SIIS device) and crystalline lattice matching considerations (in the MIMIMIM device); that is, the specific materials that may be used in the devices of Suemasu, Asada and Papp are limited by the fabrication procedures used in manufacturing these devices.

In contrast, the insulator materials used in the electron tunneling device of the present invention may be chosen from a variety of oxides and other materials that can be deposited by sputtering, atomic layer deposition, spin-on deposition, and other readily available techniques. For example, a thin layer of metal can be deposited then oxidized to form the insulator layer. Layer adhesion may be promoted by a surfactant such as one containing silanes or organic materials. In other words, the specific choice of materials used in the electron tunneling device of the present invention can be chosen for the desired electronic characteristics of the materials, rather than being limited in the choice by the fabrication procedure. Furthermore, the inclusion of the amorphous insulator in combination with the second layer of material in the electron tunneling device of the present invention yields unexpected advantages, such as resonant tunneling. The simplicity of the electron tunneling device of the present invention yields advantages not available in the SIIS nor the MIMIMIM device in the ease of fabrication and the flexibility in the selection of materials. Moreover, the use of an amorphous insulator layer in the device, which is not feasible in the MIMIMIM devices of Suemasu and Asada nor the SIIS device of Papp due to the epitaxial growth technique requirements, allows added flexibility in the selection of materials in the present device, since amorphous rather than only compatible crystalline layers can be used, thus further distinguishing the electron tunneling device of the present invention from the prior art devices.

The resonant tunneling effect and increased asymmetry and nonlinearity and reduced differential resistance in the electron tunneling device of the present invention have been verified by the Applicants by theory and experiment. In theoretical calculations, the currently available models for MIM devices were extensively modified in accordance with re-analysis of fundamental algorithms and evaluation to allow the modeling of the electron tunneling device of the present invention. The results of the theoretical calculations verified the presence of resonant tunneling and increased asymmetry and nonlinearity with reduced differential resistance in the electron tunneling device of the configuration shown in FIG. 2A.

Experimental devices were also fabricated in accordance with the present invention and tested. A thin film deposition method based on atomic layer deposition (ALD) techniques was used in the fabrication of the second layer. Other deposition techniques, such as but not limited to sputtering may also be used in place of ALD. The fabrication process described below utilizes a lift-off technique to form the patterned metal layers. Formation of the patterned metal layer is also possible by chemical etching, reactive ion etching, milling and other techniques. A summary of the fabrication process for a typical device is as follows:

1. Thoroughly clean a silicon wafer substrate including a thermal oxide less than 1 $\mu$m thick for electrical isolation between the MIM diode and silicon substrate using a combination of baking steps and de-ionized (DI) water rinses;
2. Form a base contact pad, which is resistant to the formation of a continuous ALD insulator, to function as an antenna and contact pads (for electrically accessing the device):
   a. Lithography to define the contact pad shape:
      i. $O_2$ plasma cleaning to de-scum the silicon wafer,
      ii. Spin on a primer (HMDS) at 6000 rpm for 30 seconds,
      iii. Spin on a resist at 6000 rpm for 30 seconds (time and spin speed are dependent on the specific resist used),
      iv. Pre-bake the resist layer at 90° C. for 25 minutes (time and temperature are dependent on the specific resist used),
      v. Expose the resist layer for 27 seconds (exposure time is dependent on the specific resist used and the resist thickness),
      vi. Develop the resist layer using a developer solution (4:1 ratio of DI water to developer) for a predetermined time, (developer solution depends upon specific resist and developer used)
      vii. Rinse off the developer with DI water,
      viii. $O_2$ plasma cleaning to clean the resist openings;
   b. Thermal evaporation of bond layer (100 nm of chromium) to serve as a scratch-resistant metal, through which the device can be electrically probed;
   c. Thermal evaporation of contact layer (100 nm of gold) for preventing the oxidation of the bond layer and the adhesion of a continuous ALD layer;
   d. Lift-off to remove extraneous material:
      i. Lift-off with acetone on spinner at low speed,
      ii. Ultrasonic bath with acetone (if necessary to promote lift-off),
      iii. Lift-off with acetone on spinner,
      iv. Clean with isopropyl alcohol on spinner,
      v. Spin dry;
3. Form a first non-insulating layer by repeating Step 2 (skip Step 2c) to form a 100 nm-thick Cr layer;
4. Form a first amorphous layer by oxidizing (3 days minimum under a clean hood) the first non-insulating layer to form a native oxide, less than 4 nm in thickness;
5. Form a second layer by atomic layer deposition using $Al(CH_3)_3$ and $H_2O$ precursors;
6. Form the second non-insulating layer by repeating Step 3.

The fabrication procedure described above is relatively simple, compared to the fabrication procedure of the MIM-IMIM devices of Suemasu and Asada described above, and is flexible, allowing the use of various metal and oxide materials. As mentioned above, a variety of metals, such as but not limited to chromium, aluminum, niobium, tungsten, nickel, yttrium and magnesium, and a variety of oxides, such as the native oxides of the aforementioned various metals or other oxides that can be deposited onto existing amorphous layers are suitable for use in the electron tunneling device of the present invention. The resulting devices have been measured to verify the presence of the resonance peak in the I-V curve as well as the increased asymmetry and nonlinearity with reduced differential resistance. Attention is particularly directed to Step 2c, in which an additional contact layer of a metal, such as silver or gold, is deposited on top of the chromium bond layer. In this way, the contact pad is still accessible while the insulators deposited by atomic layer deposition do not form a continuous layer. In addition, other methods of lithography, such as electron beam-assisted lithography, may be used in place of the aforedescribed photolithography steps. Also, in step 1, the coupling between the antenna and electromagnetic energy may altered by alternative substrate choices such as, but not limited to, glass, quartz and other non-conductive materials that are flat and capable of withstanding the evaporation and deposition procedures, such as those described above. Furthermore, if coupling of the electromagnetic radiation from the substrate side of the device is desired a substrate transparent to the incident electromagnetic radiation can be used in place of the silicon wafer substrate.

Figure 3A:
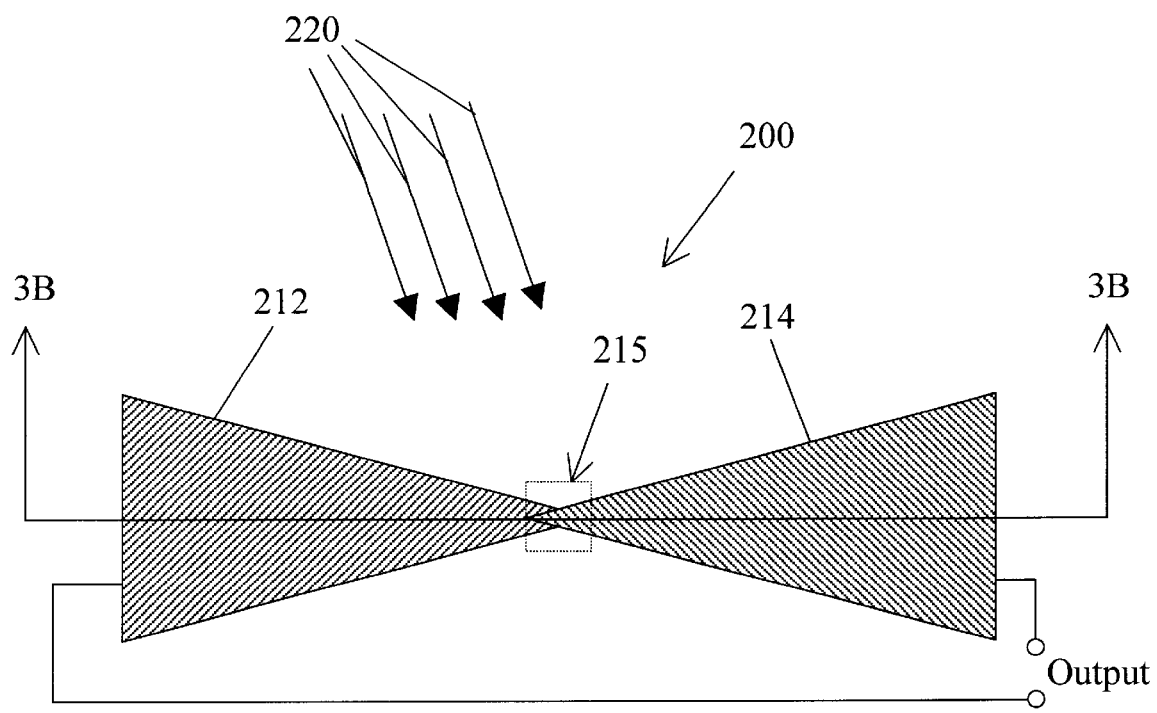
FIG. 3A is a diagrammatic top view of a device for converting solar energy incident thereon into electrical energy, designed in accordance with the present invention, shown here to illustrate a possible configuration of metal layers of the device.
Figure 3B:
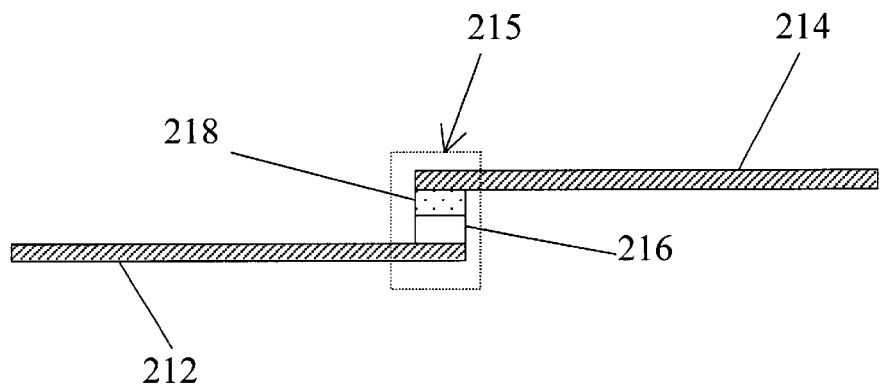
FIG. 3B is a cross sectional view of the device of FIG. 3A, shown here to illustrate additional structure positioned between the metal layers of the device.

Turning now to FIGS. 3A and 3B, a solar energy converter 200 has been developed as one application example of the present invention as described above. Solar energy converter 200 includes a first non-insulating layer 212 and a second non-insulating layer 214 corresponding to previously described layers 112 and 114, respectively. An overlap portion between the first and second non-insulating layers, indicated by a box 215, effectively forms the aforedescribed electron tunneling device. The structure of the electron tunneling device is shown more clearly in FIG. 3B, illustrating a cross sectional view of solar energy converter 200 of FIG. 3A taken along line 3B—3B. A first amorphous insulator layer 216 and a second layer 218, corresponding to previously described layers 116 and 118, respectively, are positioned in overlap portion 215 of the first and second non-insulating layers to result in the electron tunneling device of the present invention.

As shown in FIG. 3A, first and second non-insulating layers 212 and 214, respectively, are further shaped in a form of a bow-tie antenna to focus the incident solar energy on the overlap portion, thus increasing the sensitivity of the solar energy converter to incident solar energy. The bow-tie antenna is configured to increase the sensitivity of solar energy converter 200 to broadband solar energy by being receptive to electromagnetic radiation over a range of frequencies, for example, from near-ultraviolet to near-infrared frequencies. When solar energy 220 falls on solar energy converter 200, solar energy 220 is converted to a voltage between the first and second non-insulating layers to serve as the aforementioned given voltage. A directional current is established in the overlap portion in accordance with the I-V curve for the electron tunneling device of the present invention. Thus, the incident solar energy is converted to electrical energy by electrical rectification. The electrical energy can then be extracted at an output from the solar energy converter.

It is stressed that the solar energy converter of FIGS. 3A and 3B exhibit the performance advantages of the MIM-IMIM and SIIS devices while avoiding the disadvantages of the prior art devices. Namely, solar energy converter 200 is based on a simple structure of two non-insulating layers separated by two different layers positioned therebetween, where one of the two different layers is an amorphous insulator. Due to the flexible fabrication process, the exact materials used in solar energy converter 200 can be selected from a wide variety of readily available materials, such as chromium, aluminum, titanium, niobium and silicon and the respective native oxides, and not be constrained to the use of only semiconductor materials, crystalline insulators or exotic materials, such as $CoSi_2$. Also, unlike the prior art semiconductor device, which is limited in its response by the bandgap energy, the solar energy converter of the present invention is sensitive to a wide range of incident electromagnetic energies. In fact, with an appropriately designed antenna, which is configured to be sensitive to the range of frequencies within the electromagnetic spectrum of the sun, the energy conversion efficiency upper limit of the solar energy converter of the present invention approaches 100% of the energy delivered to the electron tunneling device by the antenna. Moreover, the solar energy converter of FIGS. 3A and 3B does not require the application of an external bias voltage, other than the solar energy received by the antenna structure. The fact that the solar energy converter of the present invention does not require the application of an external bias is in contrast to prior art devices which require the application of an external bias voltage.

Figure 4:
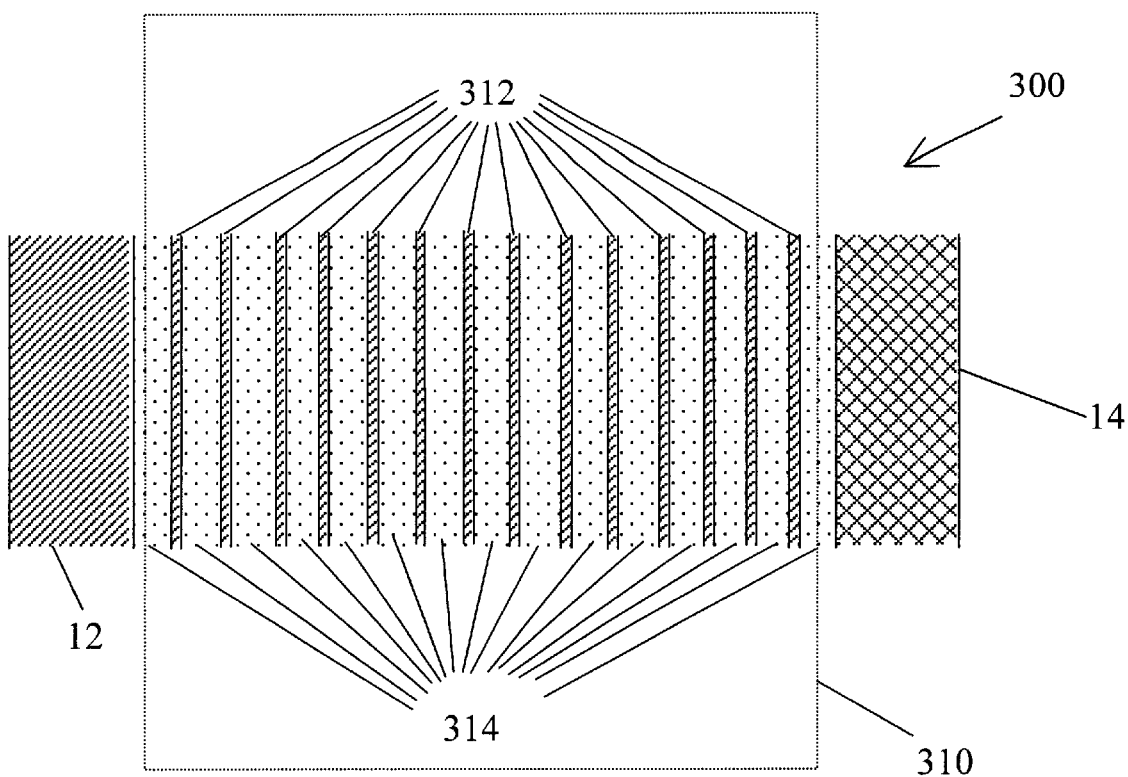
FIG. 4 illustrates a variation of the electron tunneling device of the present invention.

Turning now to FIG. 4, a variation of the electron tunneling device of the present invention is described. FIG. 4 illustrates an electron tunneling device 300 including a superlattice structure 310 positioned between first non-insulating layer 12 and second non-insulating layer 14. Superlattice structure 310 includes a plurality of thin non-insulating layers 312 separated by thin insulating layers 314. Each thin non-insulating layer 312 can be, for example, one monolayer of a metal, and each thin insulating layer 314 can be, for instance, seven monolayers of an insulator. Superlattice structure 310 provides an transport path for electrons, thus increasing electron flow between the first and second non-insulating layers. As a result, more flexibility in the design of the electron tunneling device becomes available for enhancing the performance of the device such as, for instance, increasing the device nonlinearity by selecting a suitable material to modify the height of the energy band corresponding to either the first or the second non-insulating layer.

Although each of the aforedescribed embodiments have been illustrated with various components having particular respective orientations, it should be understood that the present invention may take on a variety of specific configurations with the various components being located in a wide variety of positions and mutual orientations and still remain within the spirit and scope of the present invention. Furthermore, suitable equivalents may be used in place of or in addition to the various components, the function and use of such substitute or additional components being held to be familiar to those skilled in the art and are therefore regarded as falling within the scope of the present invention. For example, the exact materials used in the aforedescribed devices may be modified while achieving the same result of improved current-voltage performance. Also, in the solar energy converter application, other antenna shapes suitable for receiving broadband solar energy may be used in place of the bow-tie antenna.

In addition to the advantages described thus far resulting from resonant tunneling, asymmetry may be further enhanced by quantum mechanical reflections. Quantum mechanical reflections occur as a result of changes in potential energy or effective mass and are accounted for in the inventors' theoretical calculations. These reflections result for electrons tunneling both above and below the band edge of the insulator. As a result of the substantially different barrier and effective mass profile of this multilayer system over single layer MIM diodes asymmetry will be enhanced even in the absence of the resonant tunneling.

Furthermore, it is noted that the slope of the conduction band in the oxide is proportional to the electric field strength, and the electric field strength in turn depends upon the dielectric constant within the oxide. Consequently, we may tailor the voltage drop or electric field strength across each of the oxide regions by using oxides with desirable dielectric constants. By controlling the electric field strength in each layer we may further tailor the resonant energy levels location as a function of provided voltage.

Moreover, the asymmetry in the I-V curve of the device can be further enhanced by considering the electric field direction in the multilayer system. In tunneling, the electric field direction does not play a role in the magnitude of the tunneling probability. However, if an electron does not tunnel the entire distance through the oxide, perhaps due to a collision, the characteristics of the electric field will influence the post-collision electron direction. The direction, magnitude, and distribution of the electric field in the oxide layer can be controlled by selecting the work functions and Fermi levels of the electrodes and the dielectric constant of the oxide layers.

It is to be understood that the present invention, and the advantages attributed thereto can be utilized in electromagnetic device applications other than solar energy conversion devices. These applications include, but are not limited to, detectors of all of the electromagnetic frequency spectrum, emitters, modulators, repeaters and transistors, as disclosed in the applicants' copending U.S. patent application Ser. No. 09/860,972 filed simultaneously herewith and incorporated herein by reference. Additionally, an external bias voltage may be applied to the non-insulating layers in these applications to operate the device in a desired region on the I-V curve. Therefore, the present examples are to be considered as illustrative and not restrictive, and the invention is not to be limited to the details given herein but may be modified within the scope of the appended claims.

What is claimed is:
1. An electron tunneling device comprising:
   a) first and second non-insulating layers spaced apart from one another such that a given voltage can be provided across the first and second non-insulating layers; and b) an arrangement disposed between the first and second non-insulating layers and configured to serve as a transport of electrons between said first and second non-insulating layers, said arrangement including
  i) a first amorphous insulating layer configured such that using only said first amorphous insulating layer in the arrangement would result in a given value of nonlinearity in said transport of electrons, with respect to said given voltage, and
  ii) a different, second insulating layer disposed directly adjacent to and configured to cooperate with said first amorphous insulating layer such that the transport of electrons includes, at least in part, transport by means of tunneling through said first amorphous insulating layer and said second insulating layer, and such that said nonlinearity, with respect to said given voltage, is increased over and above said given value of nonlinearity by the inclusion of said second insulating layer without the necessity for any additional layers.

2. The electron tunneling device of claim 1 wherein said first amorphous insulating layer is further configured such that using only said first amorphous insulating layer in the arrangement would result in a given value of differential resistance in said transport of electrons, with respect to said given voltage, and wherein said second insulating layer is further configured to cooperate with said first amorphous insulating layer such that said differential resistance, with respect to said given voltage, is decreased below said given value of differential resistance by the inclusion of said second insulating layer without the necessity for any additional layers.

3. The electron tunneling device of claim 1 wherein said first amorphous insulating layer exhibits a first conduction band height, and wherein said second insulating layer exhibits a second conduction band height, which second conduction band height is substantially different from said first conduction band height.

4. The electron tunneling device of claim 1 wherein said second insulating layer is formed of an amorphous insulator.

5. The electron tunneling device of claim 4 wherein said first amorphous insulating layer and said second insulating layer are formed of different, amorphous insulators.

6. The electron tunneling device of claim 1 wherein the first non-insulating layer is formed of a first metal, and wherein the second non-insulating layer is formed of a different, second metal.

7. The electron tunneling device of claim 1 wherein the first and second non-insulating layers are both formed of a given metal.

8. The electron tunneling device of claim 1 wherein the transport of electrons includes, at least in part, transport by means of resonant tunneling.

9. The electron tunneling device of claim 1 wherein the first and second non-insulating layers, the first amorphous insulating layer and the second insulating layer cooperate to form a diode structure.

10. The electron tunneling device of claim 1 wherein the first and second non-insulating layers are configured to form an antenna structure for receiving electromagnetic energy, for directing said electromagnetic energy to a specific location within said electron tunneling device and for converting the electromagnetic energy so received into said given voltage provided across the first and second non-insulating layers at least at said specific location.

11. The electron tunneling device of claim 10 wherein the antenna structure is configured to receive electromagnetic energy over a broad range of frequencies.

12. The electron tunneling device of claim 11 wherein said broad range of frequencies includes frequencies from near-ultraviolet to near-infrared.

13. The electron tunneling device of claim 1 wherein the arrangement is further configured to result in a negative differential resistance in said transport of electrons for a predetermined range of voltage values for said given voltage.

14. The electron tunneling device of claim 1 wherein said arrangement consists essentially of said first amorphous insulating layer and said second insulating layer.

15. An electron tunneling device comprising:
  a) first and second non-insulating layers spaced apart from one another such that a given voltage can be provided across the first and second non-insulating layers; and
  b) an arrangement disposed between the first and second non-insulating layers and configured to provide a transport path for electrons between said first and second non-insulating layers, said arrangement consisting essentially of a plurality of thin, insulating layers, said plurality of thin, insulating layers including at least two different insulator materials and being configured such that the transport of electrons includes, at least in part, transport by means of tunneling through said plurality of thin, insulating layers.

16. In an electron tunneling device including (i) first and second non-insulating layers spaced apart from one another such that a given voltage can be provided across the first and second non-insulating layers, and (ii) an arrangement disposed between the first and second non-insulating layers and configured to serve as a transport of electrons between said first and second non-insulating layers, said arrangement including a first amorphous insulating layer, such that using only said first amorphous insulating layer in the arrangement would result in a given degree of nonlinearity in said transport of electrons between the first and second non-insulating layers, with respect to said given voltage, a method for increasing said nonlinearity in said transport of electrons, with respect to said given voltage, over and above said given degree of nonlinearity, said method comprising the steps of:
  positioning a different second insulating layer between said first and second non-insulating layers and directly adjacent to said first amorphous insulating layer and configuring said second insulating layer to cooperate with said first amorphous insulating layer such that the transport of electrons includes, at least in part, transport by means of tunneling through said first amorphous insulating layer and said second insulating layer such that said nonlinearity is increased without the necessity for any additional layers.

17. The method of claim 16 wherein said step of positioning the second insulating layer includes the step of forming the second insulating layer of an amorphous insulator material.

18. The method of claim 17 herein said step of forming the second insulating layer includes the step of depositing the amorphous insulator material by sputtering.

19. The method of claim 16 further comprising the step of configuring said arrangement such that the transport of electrons includes, at least in part, transport by means of resonant tunneling between said first and second non-insulating layers.

20. The method of claim 16 further comprising the step of configuring said arrangement such that the arrangement cooperates with said first and second non-insulating layers to form a diode structure.

21. The method of claim 16 further comprising the steps of configuring the first and second non-insulating layers to form an antenna structure for receiving electromagnetic energy, for directing said solar energy to a specific location and for converting the electromagnetic energy so received into said given voltage provided across the first and second non-insulating layers at least at said specific location.

22. The method of claim 21 wherein said step of configuring the first and second non-insulating layers to form the antenna structure includes the step of configuring the antenna structure to receive electromagnetic energy over a broad range of frequencies.

23. The method of claim 22 wherein said step of configuring the antenna structure includes the step of designing the antenna structure to be receptive to frequencies from near-ultraviolet to near-infrared.

24. A device for converting solar energy incident thereon into electrical energy, said device having an output and providing the electrical energy at the output, said device comprising:
 a) a first arrangement including first and second non-insulating layers spaced apart from one another and configured to form an antenna for receiving said solar energy incident thereon and for directing said solar energy to a specific location within said electron tunneling device; and
 b) at said specific location, a second arrangement disposed between the first and second non-insulating layers and configured to serve as a transport of electrons between said first and second non-insulating layers, said second arrangement including
  i) a first amorphous insulating layer, and
  ii) a different, second insulating layer disposed directly adjacent to and configured to cooperate with said first amorphous insulating layer such that the transport of electrons includes, at least in part, transport by means of tunneling through said first amorphous insulating layer and said second insulating layer, and such that the solar energy incident on said antenna, at least in part, is extractable as electrical energy at the output.

25. The device of claim 24 wherein said second insulating layer is formed of an amorphous insulator.

26. The device of claim 24 wherein the first non-insulating layer is formed a first metal, and the second non-insulating layer is formed of a different, second metal.

27. The device of claim 24 wherein the first and second non-insulating layers are both formed of a given metal.

28. The device of claim 24 wherein the first and second arrangements are configured to form a diode structure.

29. The device of claim 28 wherein said first and second arrangements are further configured such that said the diode structure functions as a rectifier.

30. The device of claim 28 wherein the first and second arrangements are further configured such that the device exhibits a negative differential resistance when the given voltage is in a predetermined range of values.

31. The device of claim 24 wherein said antenna is a broadband antenna structure for receiving the solar energy, for directing said solar energy to said specific location and for converting the solar energy so received into said given voltage provided across the first and second non-insulating layers at least at said specific location.

32. An electron tunneling device for converting input energy into output energy with a particular value of energy conversion efficiency, said electron tunneling device having an output and providing said output energy at said output, said electron tunneling device comprising:
 a) a first arrangement including first and second non-insulating layers spaced apart from one another and configured to receive said input energy; and
 b) a second arrangement disposed between the first and second non-insulating layers and configured to serve as a transport of electrons between said first and second non-insulating layers, said second arrangement including
  i) a first amorphous insulating layer such that using only said first amorphous insulating layer in the arrangement would result in a given value of energy conversion efficiency, with respect to a given amount of input energy, and
  ii) a different, second insulating layer disposed directly adjacent to and configured to cooperate with said first amorphous insulating layer such that the transport of electrons includes, at least in part, transport by means of tunneling through said first amorphous insulating layer and said second insulating layer, and such that said energy conversion efficiency, with respect to said given amount of input energy, is increased over and above said given value of energy conversion efficiency by the inclusion of said second insulating layer without the necessity for any additional layers.

33. The electron tunneling device of claim 32 wherein the transport of electrons includes, at least in part, transport by means of resonant tunneling.

34. The electron tunneling device of claim 32 wherein the first and second non-insulating layers are configured to form an antenna structure for receiving electromagnetic energy as said input energy and for directing said solar energy to a specific location within said electron tunneling device.

35. The electron tunneling device of claim 34 wherein the antenna structure is configured to receive electromagnetic energy over a broad range of frequencies.

36. The electron tunneling device of claim 35 wherein said broad range of frequencies includes frequencies from near-ultraviolet to near-infrared.

37. A device for converting solar energy incident thereon into electrical energy, said device having an output and providing the electrical energy at the output, said device comprising:
 a) first and second electrically conductive layers spaced apart from one another and configured to form an antenna for receiving said solar energy incident thereon and for directing said solar energy to a specific location within said device; and
 b) at said specific location, an arrangement disposed between the first and second electrically conductive layers and configured to serve as a transport of electrons between said first and second electrically conductive layers, said arrangement including
  i) a first amorphous insulating layer, and
  ii) a different, second insulating layer disposed directly adjacent to said first amorphous insulating layer and configured to cooperate with said first amorphous insulating layer such that the transport of electrons includes, at least in part, transport by means of tunneling through said first amorphous insulating layer and said second insulating layer, and such that the solar energy incident on the electrically conductive layers, at least in part, is extractable as electrical energy at the output.

38. The device of claim 37 wherein the first electrically conductive layer is formed of a first metal, and wherein the second electrically conductive layer is formed of a different, second metal.

39. The device of claim 37 wherein the first and second non-insulating layers are both formed of a given metal.

40. The device of claim 37 wherein said first amorphous insulating layer and said second insulating layer are formed of different, amorphous insulators.

41. A device for converting solar energy incident thereon into electrical energy, said device having an output and providing the electrical energy at the output, said device comprising:
- a) first and second electrically conductive layers spaced apart from one another and configured to receive said solar energy incident thereon; and
- b) an arrangement disposed between the first and second electrically conductive layers and configured to serve as a transport of electrons between said first and second electrically conductive layers, said arrangement including
    - i) a first amorphous insulating layer such that using only said first amorphous insulating layer in the arrangement would result in a given value of solar energy conversion efficiency, with respect to a given amount of said solar energy incident thereon, and
    - ii) a different, second insulating layer disposed adjacent to and configured to cooperate with said first amorphous insulating layer such that the transport of electrons includes, at least in part, transport by means of tunneling through said first amorphous insulating layer and said second insulating layer, and such that the solar energy incident on the first and second electrically conductive layers, at least in part, is extractable as electrical energy at said output while said solar energy conversion efficiency, with respect to said given amount of said solar energy incident thereon, is increased over and above said given value of solar energy conversion efficiency by the inclusion of said second insulating layer without the necessity for any additional layers.

42. The device of claim 41 wherein the first electrically conductive layer is formed of a first metal, and wherein said second electrically conductive layer is formed of a different, second metal.

43. A method for converting solar energy into electrical energy and providing said electrical energy at an output, said method comprising the steps of:
- a) providing first and second non-insulating layers, which are spaced apart from one another such that a given voltage can be provided therebetween, and configuring said first and second non-insulating layers to form an antenna structure for receiving said solar energy incident thereon and for directing said solar energy to a specific location;
- b) at said specific location, positioning an arrangement between the non-insulating layers, said arrangement including a first amorphous insulating layer and a different, second insulating layer disposed directly adjacent to said first amorphous insulating layer; and
- c) configuring said arrangement to serve as a transport of electrons between said first and second non-insulating layers such that the transport of electrons includes, at least in part, transport by means of tunneling, and such that the solar energy incident on the first and second non-insulating layers, at least in part, is extractable as electrical energy at said output.

44. The method of claim 43 wherein said step of configuring the arrangement includes the step of forming the second insulating layer of an amorphous insulator.

45. The method of claim 43 wherein said step of configuring the arrangement includes the step of configuring the first and second non-insulating layers, the first amorphous insulating layer and the second insulating layer to form a diode structure.

46. The method of claim 43 wherein said step of configuring the first and second non-insulating layers includes the step of configuring said antenna as a broadband antenna structure for receiving the solar energy and converting the solar energy so received into said given voltage provided across the first and second non-insulating layers.

47. An electron tunneling device comprising:
- a) first and second pon-insulating layers spaced apart from one another such that a given voltage can be provided across the first and second non-insulating layers; and
- b) an arrangement disposed between the first and second non-insulating layers and configured to serve as a transport of electrons between said first and second non-insulating layers, said arrangement including a first layer of an amorphous insulator and a second layer of a different amorphous insulator disposed directly adjacent to said first layer of amorphous insulator, said arrangement being configured such that the transport of electrons includes, at least in part, transport by means of resonant tunneling.

48. An electron tunneling device comprising:
- a) first and second non-insulating layers spaced apart from one another such that a given voltage can be provided across the first and second non-insulating layers; and
- b) an arrangement disposed between the first and second non-insulating layers and configured to serve as a transport of electrons between and to said first and second non-insulating layers, said arrangement including
    - i) a first amorphous insulating layer configured such that using only said first amorphous insulating layer in the arrangement would result in a given value of asymmetry in said transport of electrons, with respect to said given voltage, and
    - ii) a different, second insulating layer disposed directly adjacent to and configured to cooperate with said first amorphous insulating layer such that the transport of electrons includes, at least in part, transport by means of tunneling through said first amorphous insulating layer and said second insulating layer, and such that said asymmetry, with respect to said given voltage, is increased over and above said given value of asymmetry by the inclusion of said second insulating layer without the necessity for any additional layers.

49. An electron tunneling device comprising:
- a) first and second non-insulating layers spaced apart from one another such that a given voltage can be provided across the first and second non-insulating layers; and
- b) an arrangement disposed between the first and second non-insulating layers and configured to serve as a transport of electrons between and to said first and second non-insulating layers, said arrangement including
    - i) a first amorphous insulating layer configured such that using only said first amorphous insulating layer in the arrangement would result in a given value of differential resistance in said transport of electrons, with respect to said given voltage, and
    - ii) a different, second insulating layer disposed directly adjacent to and configured to cooperate with said first amorphous insulating layer such that the transport of electrons includes, at least in part, transport by means of tunneling, and such that said differential resistance, with respect to said given voltage, is decreased below said given value of differential resistance by the inclusion of said second insulating layer without the necessity for any additional layers.

50. An electron tunneling device comprising:

a) first and second non-insulating layers spaced apart from one another such that a given voltage can be provided across the first and second non-insulating layers; and b) an arrangement disposed between the first and second non-insulating layers and configured to serve as a transport of electrons between said first and second non-insulating layers, said arrangement including i) a first amorphous insulating layer configured such that using only said first amorphous insulating layer in the arrangement would result in a given value of nonlinearity in said transport of electrons, with respect to said given voltage, and ii) a different, second insulating layer disposed directly adjacent to and configured to cooperate with said first amorphous insulating layer so as to provide a quantum well through which resonant tunneling occurs upon application of said given voltage across the first and second non-insulating layers such that the transport of electrons between and to said first and second non-insulating layers through said first amorphous insulating layer and said second insulating layer includes, at least in part, transport by means of resonant tunneling, and such that said nonlinearity, with respect to said given voltage, is increased over and above said given value of nonlinearity by the inclusion of said second insulating layer without the necessity for any additional layers.

51. The electron tunneling device of claim 50 wherein said arrangement is further configured to include at least one, and no more than two, quantum well when said given voltage is provided across the first and second non-insulating layers such that said transport of electrons includes at most four segments of tunneling from said first non-insulating layer to reach said second non-insulating layer.

* * * * *